(12) United States Patent
Wu et al.

(10) Patent No.: US 9,866,018 B2
(45) Date of Patent: Jan. 9, 2018

(54) SYSTEM AND METHOD FOR TRANSISTOR VOLTAGE CONTROL

(71) Applicant: Dell Products, LP, Round Rock, TX (US)

(72) Inventors: Wickman (Feng-Yu) Wu, Taipei (TW); Vincent Chia Hung Chen, Taipei (TW)

(73) Assignee: DELL PRODUCTS, LP, Round Rock, TX (US)

( * ) Notice: Subject to any disclaimer, the term of this patent is extended or adjusted under 35 U.S.C. 154(b) by 259 days.

(21) Appl. No.: 14/920,672

(22) Filed: Oct. 22, 2015

(65) Prior Publication Data

US 2017/0117706 A1  Apr. 27, 2017

(51) Int. Cl.
*H02J 1/00* (2006.01)
*H02M 1/08* (2006.01)

(52) U.S. Cl.
CPC .............. *H02J 1/00* (2013.01); *H02M 1/08* (2013.01)

(58) Field of Classification Search
CPC .................................. H02M 1/08; H02J 1/00
USPC ........................................................ 307/125
See application file for complete search history.

(56) References Cited

U.S. PATENT DOCUMENTS

| | | | |
|---|---|---|---|
| 6,903,597 B2 | 6/2005 | Tai | |
| 7,952,418 B2 | 5/2011 | McDonald et al. | |
| 2006/0012354 A1* | 1/2006 | Nunokawa | G05F 1/575 323/273 |
| 2009/0059630 A1* | 3/2009 | Williams | H02M 3/07 363/60 |
| 2012/0098511 A1 | 4/2012 | Tsai et al. | |
| 2014/0266323 A1* | 9/2014 | McIntosh | H02M 1/08 327/109 |
| 2016/0091909 A1* | 3/2016 | Olejarz | G05F 1/56 323/280 |
| 2017/0018220 A1* | 1/2017 | Takahara | G09G 3/3233 |

* cited by examiner

*Primary Examiner* — Jared Fureman
*Assistant Examiner* — Duc M Pham
(74) *Attorney, Agent, or Firm* — Larson Newman, LLP

(57) ABSTRACT

Systems and methods are drawn to controlling transistor gate voltages in load-switcher circuitry. A buffer may be applied to a load-switcher transistor to leverage the Miller effect. A slow gate charge circuit may be coupled to the gate of the transistor to control application of voltage to the gate and capacitances associated therewith. The buffer and slow gate charge circuit may be used in conjunction to control characteristics of the voltage applied to the gate of the transistor.

19 Claims, 9 Drawing Sheets

SYSTEM AND METHOD FOR TRANSISTOR VOLTAGE CONTROL

FIELD OF THE DISCLOSURE

The present disclosure generally relates to powering loads with load-switcher circuitry, and more particularly relates to controlling transistor voltages in load-switcher circuitry.

BACKGROUND

As the value and use of information continues to increase, individuals and businesses seek additional ways to process, store, and communicate information. One option is an information handling system. Information handling systems generally process, compile, store, and/or communicate information or data for business, personal, or other purposes. Because technology and information handling needs and requirements vary between different applications, information handling systems may also vary regarding what information is handled, how the information is processed, stored, or communicated, and how quickly and efficiently the information may be processed, stored, or communicated. The variations in information handling systems allow information handling systems to be general purpose systems or to be configured for specific uses or users, such as for financial transaction or reservation processing, for enterprise data storage, for global communications, or for other specific uses or users. In addition, information handling systems may include a variety of hardware and software resources that may be configured to process, store, and communicate information and may include one or more computer systems, data storage systems, and networking systems.

Voltage regulators may be used in integrated circuits or other circuitry to power loads. For example, control circuitry can be used to control a set of voltage regulators to power a corresponding set of loads.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
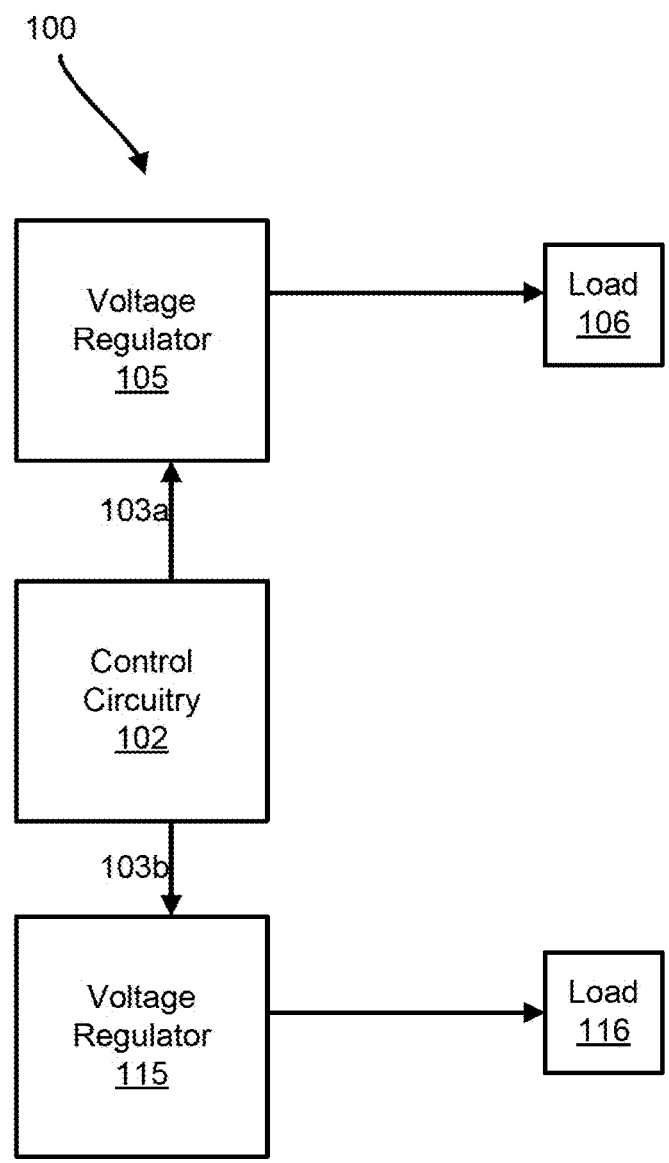
FIG. 1 is a schematic diagram of an embodiment of a voltage regulator system for powering loads.

FIG. 1 illustrates an information handling system 100 in which a set of voltage regulators are used to power a set of loads. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Voltage regulators may be used in integrated circuits or other circuitry to power loads. For example, control circuitry can be used to control a set of voltage regulators to power a corresponding set of loads. System 100 comprises control circuitry 102, voltage regulators 105 and 115, and loads 106 and 116. As shown, control circuitry 102 controls voltage regulator 105 via control signals 103a to power corresponding load 106. Similarly, control circuitry 102 controls voltage regulator 115 via control signals 103b to power corresponding load 116. Voltage regulators are generally bulky device that consume space in integrated circuits or printed circuit boards (PCBs). For example, a voltage regulator may take up a relatively large space on a PCB relative to other components. In certain applications, the output voltages and power of the voltage regulators may be similar within a threshold to power the loads. For example, in system 100, loads 106 and 116 may require the same (maximum, or minimum) or similar voltage and power to be provided by voltage regulators 105 and 115.

Figure 2:
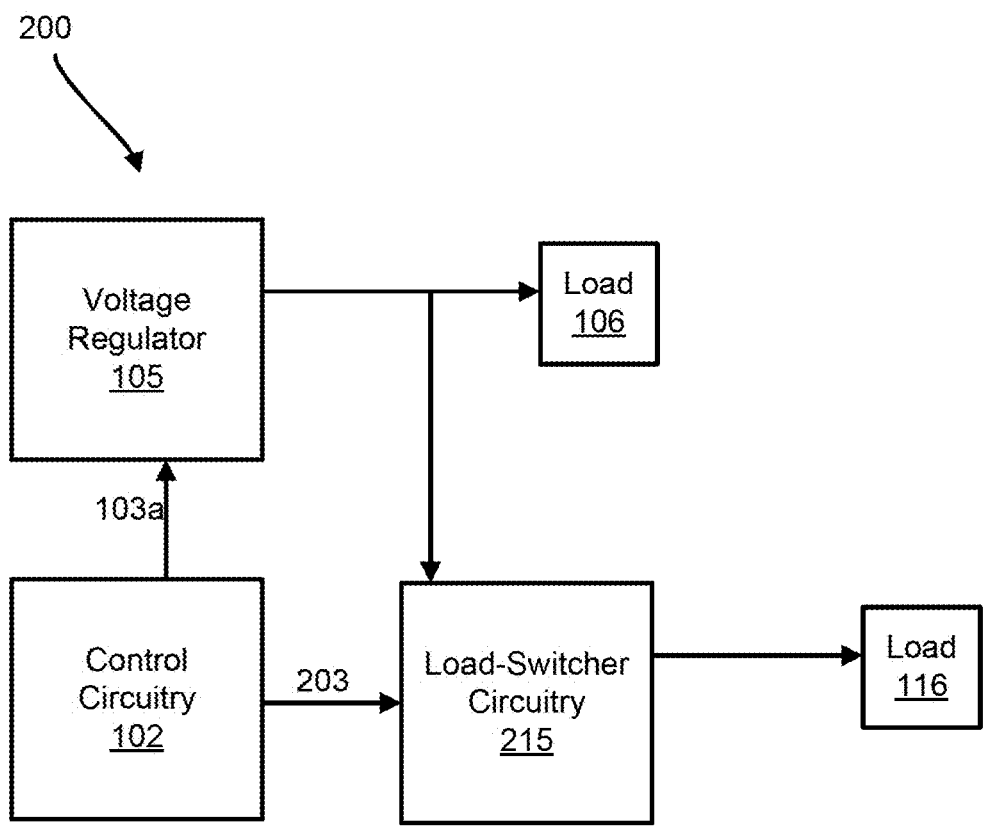
FIG. 2 is a schematic diagram of an embodiment of a voltage regulator system with load-switcher circuitry.

To free up area on a silicon die or PCB for other components, load-switcher circuitry may be used with a voltage regulator to eliminate the need for a further voltage regulator to power a further load. FIG. 2 illustrates a system 200 using load-switcher circuitry instead of a further voltage regulator to power a further load. In system 200, voltage regulator 115 has been replaced with load-switcher circuitry 215. Thus, system 200 comprises control circuitry 102, voltage regulator 105, load-switcher circuitry 215, and loads 106 and 116. In system 200, shown, control circuitry 102 controls voltage regulator 105 via control signals 103a to power corresponding load 106, and to also power load-switcher circuitry 215. Control circuitry 102 further controls load-switcher circuitry 215 via control signals 203 to power load 116. Thus, system 200 includes a single voltage regulator providing power to load 106 and load-switcher circuitry 215—which replaces voltage regulator 115 of system 100 to provide power to load 116.

Load-switcher circuitry generally include one or more transistors, such as a Field Effect Transistor (FET), which may be implemented, for example, as a metal oxide semiconductor FET (MOSFET). In load-switcher circuitry topologies, the MOSFET component may occupy a relatively large portion of the area of the load-switcher circuitry. Thus, it may be desired to minimize the relative size of the MOSFET in the load-switcher circuitry. As would be understood by one of skill in the art, a physical MOSFET coupled in a circuit empirically has a source-drain resistance and three parasitic capacitances: a parasitic capacitance between source and drain, a parasitic capacitance between gate and drain, and a parasitic capacitance between gate and source. A physical MOSFET will have voltages corresponding to each of the parasitic capacitances. Gate-source voltage fluctuations and the maximum values thereof strain a MOSFET, and the MOSFET must be sized large enough to handle maximum gate-source voltage swings.

Thus, to minimize the size of the MOSFET component of load-switcher circuitry it is desired to reduce the voltage stress on the MOSFET by controlling the voltage and power applied to the MOSFET in the load-switcher circuitry. Furthermore, there is a correlation between the source-drain resistance and the voltage applied to the MOSFET: the higher the voltage applied, the higher the relative source-drain resistance, and inversely, the lower the voltage applied, the lower the relative source-drain resistance.

The Miller effect may be leveraged to reduce the voltage stress on the MOSFET by controlling the voltage and power applied to the MOSFET in the load-switcher circuitry. To this end, an external buffer may be connected between drain and gate to control the MOSFET on/off speed. Further, a slow gate charge circuit may be implemented in the load switcher circuitry relative to the MOSFET (and the gate of the MOSFET), to control gate-source voltage parameters of the MOSFET.

Still further, voltage stress on the MOSFET may be reduced by controlling the timing of applying a voltage supply to the MOSFET. For example, the supply voltage could be applied to the MOSFET at an earlier time than otherwise. Thus, an external buffer, a slow gate charge circuit, and controlled temporal application of the supply voltage to a MOSFET may be used to reduce the voltage stress on the MOSFET.

Figure 3A:
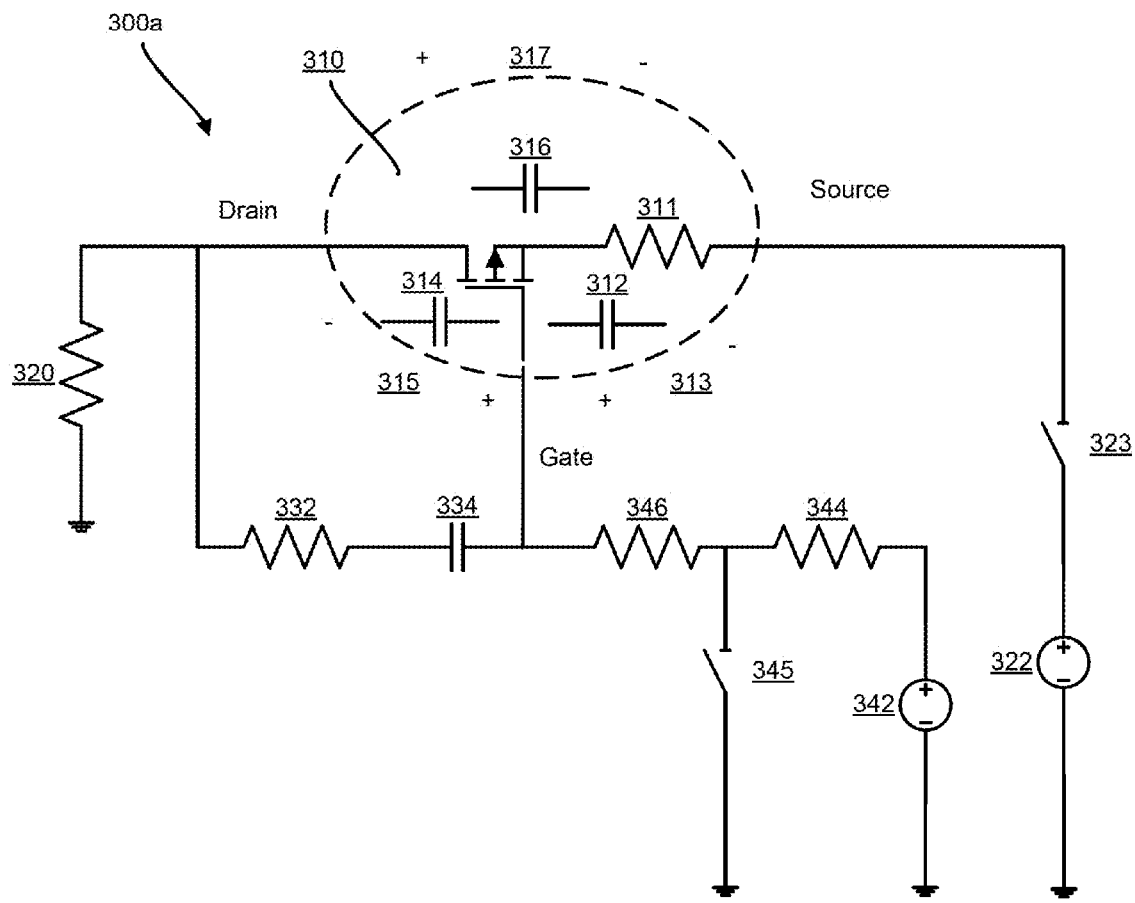
FIGS. 3a-3e are circuit diagrams of an embodiment of load-switcher circuitry at different stages of operation.

FIG. 3a illustrates an example of load-switcher circuitry 300a utilizing a MOSFET 310. Load-switcher circuitry 300a includes load 320 (illustrated as a resistor to indicate power loss) and voltage supply 322, which corresponds to the voltage output of voltage regulator 105 of system 200. As illustrated, the drain of MOSFET 310 is coupled to load 320. As illustrated, voltage supply 322 is coupled to the source of MOSFET 310 via switch 323 which may be opened or closed to connect or disconnect the voltage output of voltage supply 322 with the source of MOSFET 310.

Resistor 332 and capacitor 334 form a buffer or part of a buffer to control MOSFET 310 on/off speed. Resistor 332 and capacitor 334 are connected in series (between gate and drain). As illustrated, capacitor 334 is connected to the gate of MOSFET 310 and resistor 332 is connected to the drain of MOSFET 310. Resistors 344 and 346 together with switch 345 form a slow gate charge circuit or part of a slow gate charge circuit. Control voltage 342 corresponds to control signals 203 of system 200 and is connected to the gate of MOSFET 310 via resistors 344 and 346, which are connected in series. One end of resistor 344 is coupled to control voltage 342, while the antipodal end of resistor 344 is coupled to switch 345 which is configured to be operable to short the voltage output of control voltage 342 to ground via resistor 344, thereby allowing for controlled application of voltage from control voltage 342 to control the gate of MOSFET 310. Resistor 346 is coupled to the antipodal end of resistor 344, and to the gate of MOSFET 310, thereby coupling resistor 344 to the gate.

Turning to MOSFET 310, MOSFET 310 has a source, drain, and controlling gate, as labeled in system 300a. As illustrated, MOSFET 310 is a p-type FET with an active-off gate control voltage. MOSFET 310 has an inherent resistance from source to drain, illustrated as resistor 311. MOSFET 310 further has parasitic capacitances 312, 314, and 316. Capacitance 312 is the parasitic capacitance between gate and source. Capacitance 314 is the parasitic capacitance between gate and drain. And capacitance 316 is the parasitic capacitance between drain and source.

The respective resistances of resistors 344 and 346 are selected for charging and discharging parasitic capacitances 312 and 314 (the parasitic capacitances associated with the gate of MOSFET 310). More particularly, since resistors 344 and 346 are in series between the gate of MOSFET 310 and control voltage 342, the effective resistance of the combination of resistors 344 and 346 slow the application of voltage from control voltage 342 to the gate of MOSFET 310, thereby slowing the charging of capacitances 312 and 314 by control voltage 342. Switch 345 uses shorting control voltage 342 to control the application of voltage from control voltage 342 to the gate of MOSFET 310. When switch 345 is electrically connected to ground, parasitic capacitances 312 and 314 discharge through resistor 346 to ground.

More particularly, when switch 345 is operated to disconnect resistor 344 from ground, control voltage 342 is electrically coupled to the gate of MOSFET 310 via resistors 344 and 346, and the voltage of control voltage 342 charges capacitances 312 and 314, as well as capacitor 334 (allowing for the resistance values of resistors 344 and 346 to affect a rate of charge of capacitances 312 and 314). Furthermore, since capacitor 334 is also simultaneously charging along with charging capacitances 312 and 314, the capacitance value of capacitor 334 affects the rate of charge of capacitances 312 and 314.

Conversely, when switch 345 is operated to connect resistor 344 to ground, control voltage 342 is electrically decoupled from the gate of MOSFET 310 because control voltage 342 is shorted to ground via resistor 344. Furthermore, when switch 345 is operated to connect resistor 344 to ground, as illustrated in FIG. 3a, one end of resistor 346 will also be shorted to the ground, and parasitic capacitances 312 and 314 will be connected to ground, and charge from parasitic capacitances 312 and 314 will flow to the ground via resistor 346 and switch 345. Thus, the resistance value of resistor 346 controls the rate of discharge of capacitances 312 and 314.

Still further, as shown in FIG. 3a, capacitor 334 is coupled to the gate of MOSFET 310 and helps to control the rate of discharge of capacitances 312 and 314, because as shown in FIG. 3a, capacitor 334 is coupled to resistor 346 in parallel with parasitic capacitances 312 and 314, and as such, when charged, provides a voltage potential that must flow through resistor 346 to ground, thereby affecting, for example, slowing, the rate of discharge of capacitances 312 and 314.

Furthermore, switch 323 may be controlled by control circuitry to control the temporal application of voltage of voltage supply 322 to MOSFET 310. For example, control circuitry may be configured to cause switch 323 to couple voltage supply 322 to MOSFET 310 earlier than otherwise to reduce the overall voltage stress on MOSFET 310 and reduce the relative resistance of resistor 311 (the drain-source resistance).

FIGS. 3b-3e are equivalent circuit diagrams to system 300a of FIG. 3a at different temporal stages of operation of system 300a. Furthermore, FIG. 4 provides a graph 400 of the voltages across capacitances 312, 314, and 316 at different temporal stages of operation of system 300a, and will be discussed in conjunction with FIGS. 3a-3e.

Figure 3B:
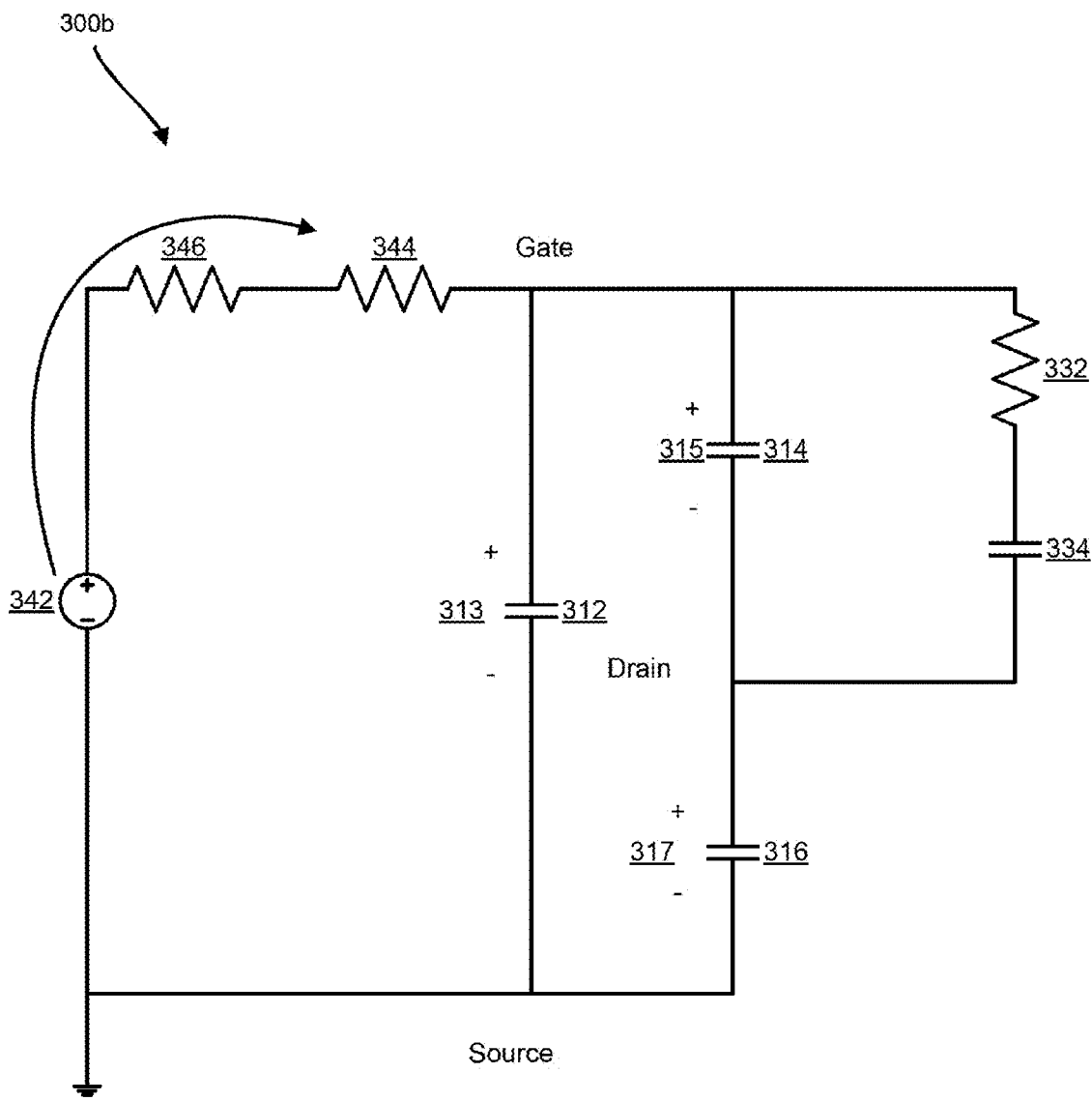
Figure 4:
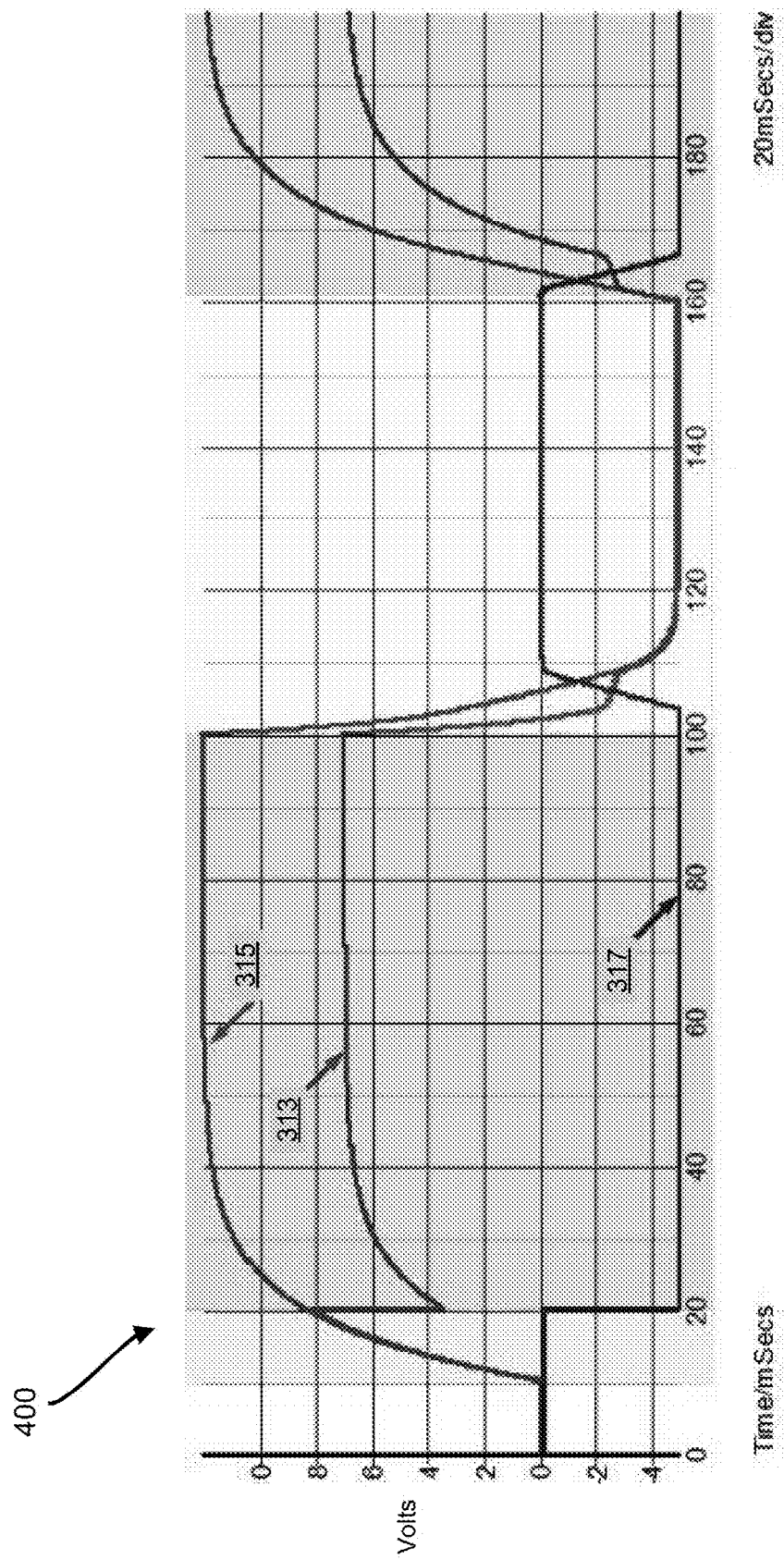
FIG. 4 is a graph of transistor voltages according to an embodiment.

System 300b of FIG. 3b is the equivalent circuit to system 300a when voltage supply 322 is disconnected from system 300a by switch 323 (or the voltage regulator 105 is turned off via control circuitry 102 as shown in 200), control voltage 342 is not shorted to ground by switch 345 and resistor 344, and MOSFET 310 is going to off (due to the application of control voltage 342). This state is illustrated in FIG. 4 from 10-20 milliseconds (mS). In this state, charge from control voltage 342 flows though resistances 344 and 346 to charge parasitic capacitances 312 and 314, and a corresponding voltage is applied to parasitic capacitances 312 and 314 as illustrated by the rising voltages 313 and 315 of graph 400. Control voltage 342 is disjoint with regard parasitic capacitance 316 and there is not voltage potential formed by control voltage 342 with regard to parasitic capacitance 316, and therefore voltage 317 is zero, as illustrated from 10-20 milliseconds of graph 400. The combination of resistors 344 and 346 slow the increase of voltage 313 (gate-source voltage), and pull down the voltage value of control voltage 342, thereby helping to reduce voltage 313 over the illustrated 10-20 milliseconds of graph 400.

Figure 3C:
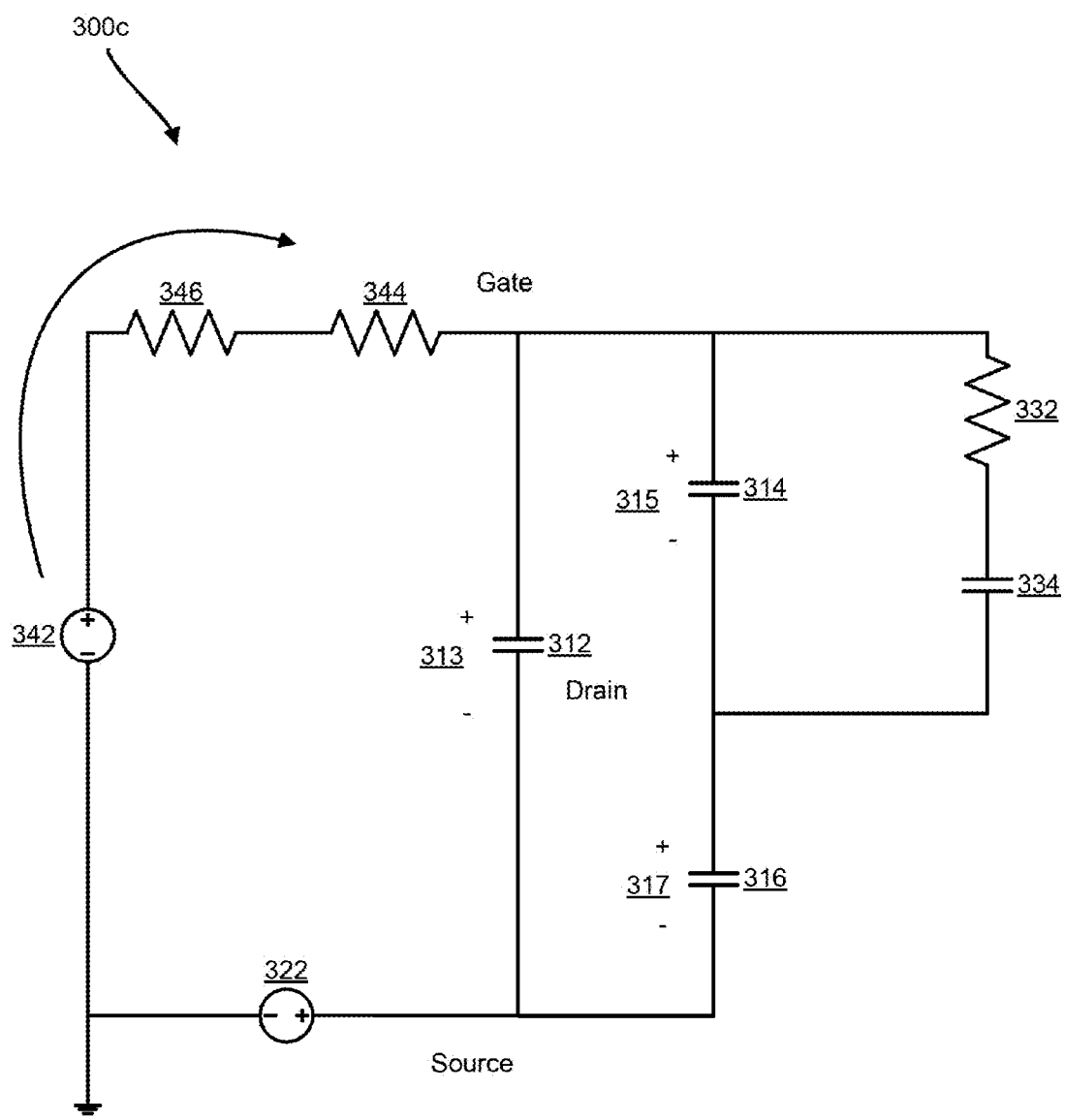

System 300c of FIG. 3c is the equivalent circuit to system 300a when voltage supply 322 is connected to system 300a by switch 323 (more particularly, the source of MOSFET 310) and control voltage 342 is not shorted to ground by switch 345 (and therefore control voltage 342 is applied to the gate of MOSFET 310, ensuring that MOSFET 310 is off). This state is illustrated in FIG. 4 from 20-100 milliseconds (mS). With regard to voltage 313 (the gate source voltage of MOSFET 310), after a transitory phase, in which voltage 313 drops with the addition of voltage supply 322 to a voltage value of the voltage value of voltage control 342 minus voltage supply 322 (voltage control 342–voltage 322), voltage 313 increases asymptotic to a voltage value as in graph 400. In other words, the voltage applied to parasitic capacitance 312 drops to control voltage 342 minus voltage 322, then rises asymptotic to a voltage.

Meanwhile, in system 300c, voltage 315 continues to increase asymptotic to the voltage value of voltage supply 322 such that parasitic capacitance 314 charges to the voltage value of voltage supply 322. This is shown by the rising asymptotic voltage 315 of graph 400. Simultaneously, voltage 317 drops to a negative value, as illustrated in graph 400.

Figure 3D:
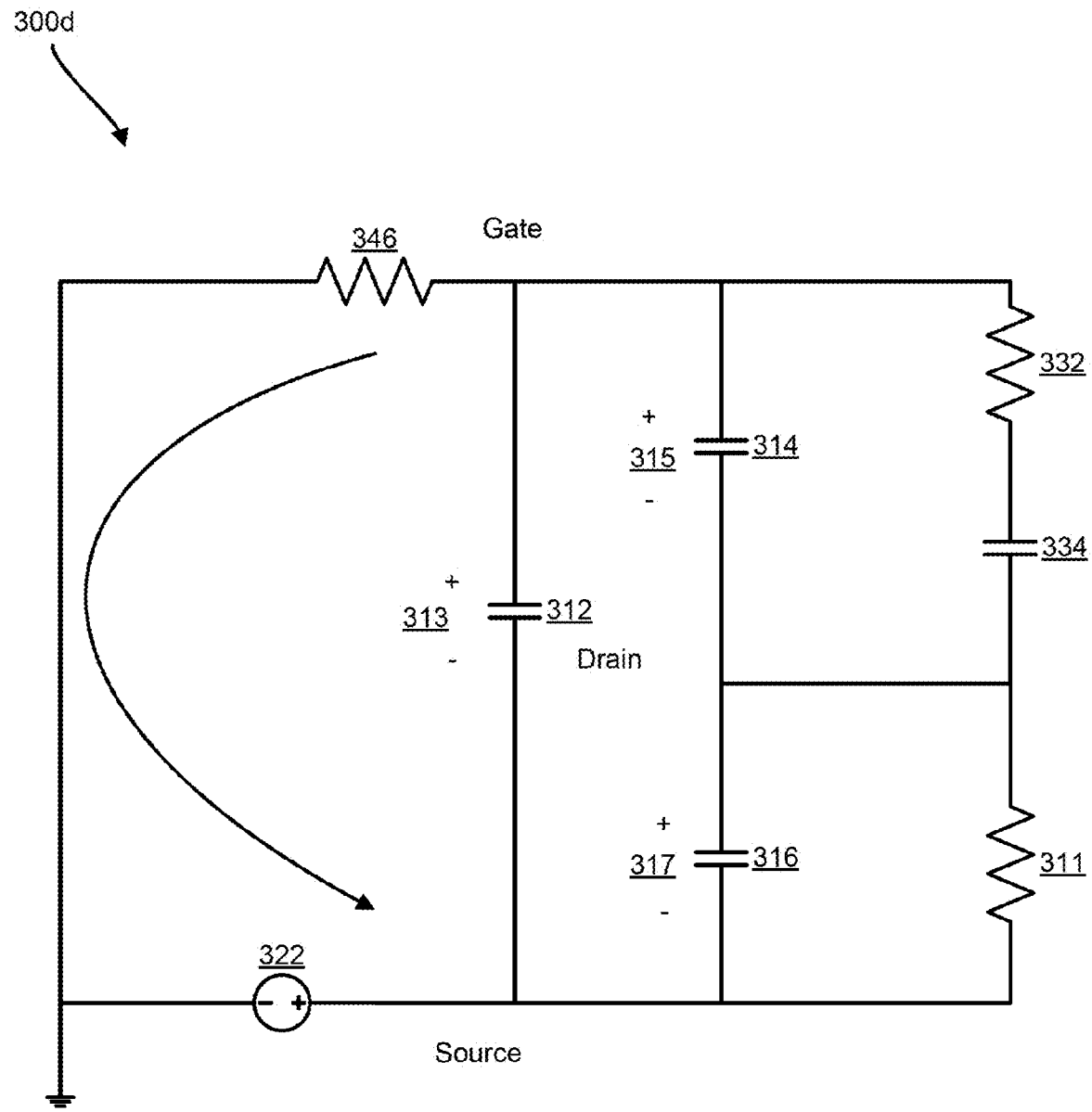

System 300d of FIG. 3d is the equivalent circuit to system 300a when voltage supply 322 is connected to system 300a by switch 323 (more particularly, the source of MOSFET 310) and control voltage 342 is shorted to ground by switch 345, thereby removing the voltage of control voltage 342 from the gate of MOSFET 310. This state is illustrated in FIG. 4 from 100-160 milliseconds (mS). Since MOSFET 310 is an active control P-type FET, the control voltage is 342 is no longer applied to the gate of MOSFET 310, but is shorted to ground, MOSFET 310 turns on and a channel resistance 311 is formed between drain and source. As can be seen from graph 400, voltage 313 drops below zero and is asymptotic with a negative voltage value as the polarity of charge applied across parasitic capacitance 312 reverses as voltage supply 322 becomes the only voltage supply with the removal of control voltage 342 by shorting to ground.

Similarly, as can be seen from graph 400, voltage 315 drops below zero and is asymptotic with the negative voltage value as the polarity of charge applied across parasitic capacitance 314 reverses as voltage supply 322 becomes the only voltage supply with the removal of control voltage 342 by shorting to ground. As would be understood by one of skill in the art, due to the shorting of control voltage 342 to ground, parasitic capacitances (the parasitic capacitances of the gate of MOSFET 310) discharge with current flowing through resistor 346 to ground (resistor 344 being shorted to ground with control voltage 342). Consequently, as discussed above, the resistance value of resistor 346 controls the discharge of parasitic capacitances 312 and 314, and therefore helps control the voltage swings across the gate and source and the gate and drain of MOSFET 310.

As can be further seen from graph 400, voltage 317 rises from the negative voltage value to zero as MOSFET 310 turns on and the channel between the source and drain becomes active. The opening of the channel reduces parasitic capacitance 316 (between source and drain) to zero such that voltage 717 across parasitic capacitance 316 asymptotes to zero.

Figure 3E:
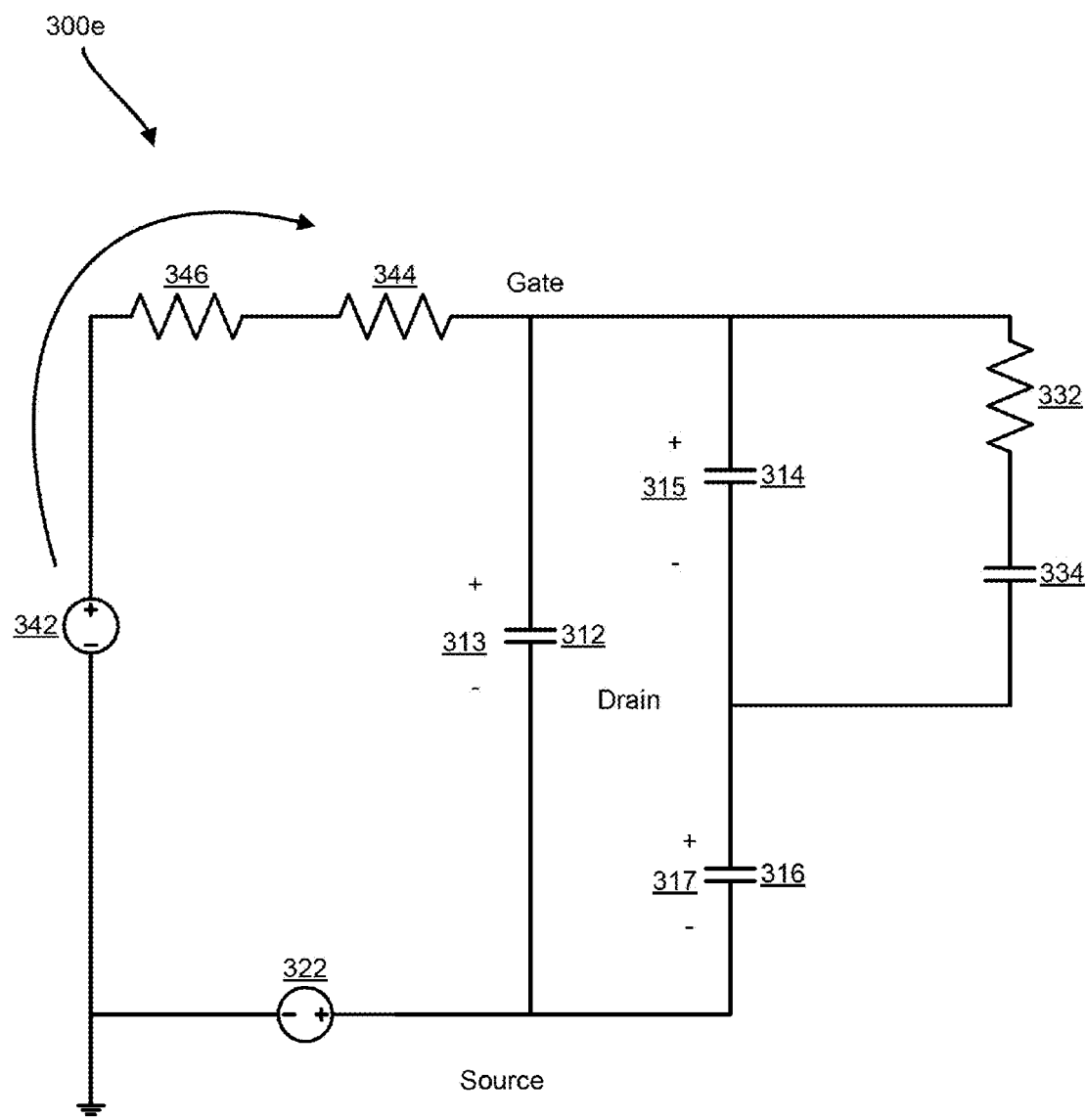

System 300e of FIG. 3e is the equivalent circuit to system 300a when voltage supply 322 is connected to system 300a by switch 323 (more particularly, the source of MOSFET 310) and control voltage 342 is not shorted to ground by switch 345, and therefore a voltage is applied to the gate of MOSFET 310. This state is illustrated in FIG. 4 from 160 milliseconds (mS) forth. Since MOSFET 310 is an active control P-type FET, and since control voltage is 342 is applied to the gate of MOSFET 310, and is no longer shorted to ground, MOSFET 310 is turning off and the channel between drain and source is fading. As can be seen from graph 400, voltage 317 drops below zero as the channel between source and drain fades, and parasitic capacitance 316 (between source and drain) forms which is negatively charged by the combination of control voltage 342 and voltage supply 322.

As can further be seen from graph 400, voltages 313 and 315 rise from the negative voltage value to asymptote different final voltages. Referring to system 300e, the voltage combination of control voltage 342 and voltage supple 322 are applied to parasitic capacitances 312 and 314 (the parasitic capacitances associated with the gate of MOSFET 310) to charge parasitic capacitances 312 and 314 via resistors 344 and 346 such that the resistor values of resistors 344 and 346 affect the rate of charge of parasitic capacitances 312 and 314. Thus, the resistance values of resistors 344 and 346 may be selected to control a rate of charge of parasitic capacitances 312 and 314. Further more, as can be seen from graph 400, while voltage 315 rises asymptotic to the voltage of voltage supply 322, voltage 313, is asymptotic to a lower voltage value.

In embodiments, the value of resistor 344 may be 5.9 kOhms and the value of resistor 346 may be 2.2 kOhms. The maximum voltage of control voltage 342 may be 12 volts and the voltage of supply voltage 322 may be 5 volts.

Embodiments described above have numerous advantages. For example, embodiments of the mechanism described above allow for less voltage stress on a transistor by means of the extra resistor-capacitor buffer and resistor based timing control of the on/off of the transistor. This mechanism does not require a further big MOSFET rating. Further, the buffer capacitor may be within a twenty percent margin of ten times the capacitance of the combined parasitic capacitances of the gate and may help compensate the parasitic capacitance of the transistor. This further helps prevent a spike current exceeding the system specification. Further the above-described transistor based system helps to improve efficiency. In addition, the lower voltage applied to the transistor in embodiments of the transistor mechanism described herein results in a lower source drain resistance, and therefore a smaller transistor may be used in a system. Embodiments further allow for the voltage control circuitry to reduce power stress on the transistor. Furthermore, embodiments mitigate power supply dip when load-switcher circuitry transitions between on and off.

Figure 5:
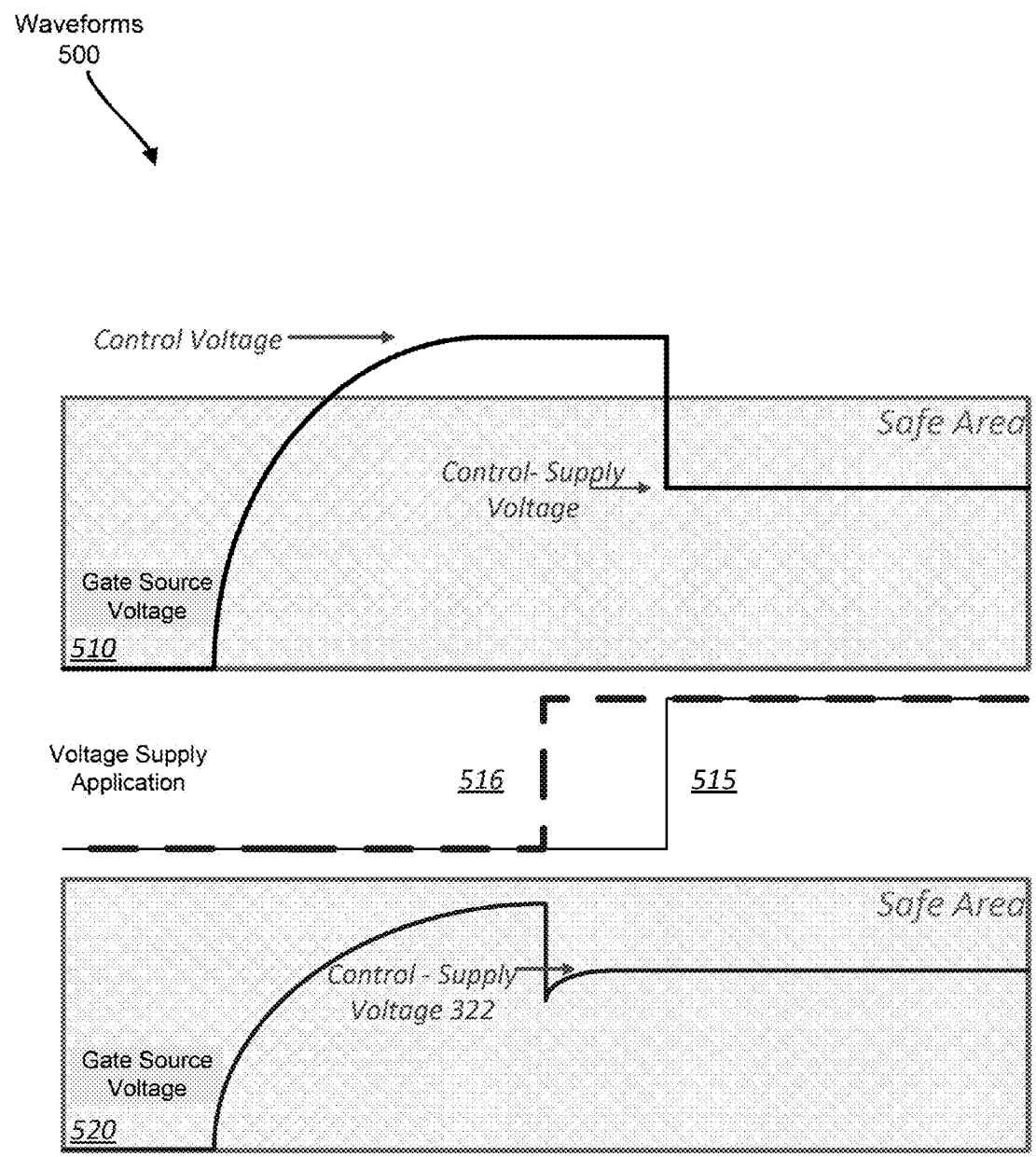
FIG. 5 is a graph of voltage waveforms according to an embodiment.

FIG. 5 illustrates waveforms 500 exemplifying advantages of embodiments of mechanism and systems disclosed herein. Waveform 510 is a graph of the voltage applied to the gate-source of a transistor of load-switcher circuitry lacking an external buffer and slow gate charge circuit. Furthermore, waveform 510 is a graph of the voltage applied to the gate-source of a transistor of load-switcher circuitry without changing the temporal application of the supply voltage to the transistor. As can be seen from waveform 510, the maximum voltage approaches the supply voltage and as such may exceed a maximum transistor safe voltage, as illustrated. Waveform 520 is a graph of the voltage applied to the gate-source of a transistor of load-switcher circuitry including an external buffer and slow gate charge circuit. Furthermore, waveform 520 is a graph of the voltage applied to the gate-source of a transistor of load-switcher circuitry in which the temporal timing of the application of the supply voltage to the transistor is changed. As can be seen from waveform 520, the maximum voltage is maintained within a maximum transistor safe voltage, as illustrated.

Waveform 515 and 516 illustrate the supply voltage as applied to the source of a load-switcher circuit transistor with different temporal timings. Waveform 515 is a graph of the application of the supply voltage to the transistor without changing the temporal application of the supply voltage to the transistor. Typically the supply voltage is applied to the transistor when the prior voltage rail is stable, for example that Vgs 313 be charged as control voltage 342. Referring to waveform 510 which illustrates the effects of the temporal application of the supply voltage as delineated by waveform 515, the gate source voltage immediately drops into the safe area when the supply voltage is applied to the transistor.

Waveform 516 (the dashed waveform superimposed on waveform 515) is a graph of the application of the supply voltage to the transistor with changing the temporal application of the supply voltage to the transistor. More particularly, the temporal application of the supply voltage to the transistor may be brought forward as illustrated by waveform 516 increasing to the supply voltage prior to waveform 515. Referring to waveform 520 which illustrates the effects of the temporal application of the supply voltage as delineated by waveform 516, the gate source voltage is brought down sooner compared to waveform 510. This helps mitigate voltage stress on the transistor. The temporal application of the supply voltage to the transistor may be determined by a desired slow charging duration of Vgs 313.

Although only a few exemplary embodiments have been described in detail herein, those skilled in the art will readily appreciate that many modifications are possible in the exemplary embodiments without materially departing from the novel teachings and advantages of the embodiments of the present disclosure. For example, while the above has been discussed with regard to a p-type MOSFET, the methods discussed above may be used with any type of transistor to control the voltage stress on the transistor. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
a voltage regulator;
control circuitry coupled to control the voltage regulator; and
load-switcher circuitry coupled to receive power output from the voltage regulator and coupled to receive control signals from the control circuitry, the load switcher circuitry including a transistor and a buffer coupled between a gate and a drain of the transistor.

2. The apparatus of claim 1 further comprising:
a slow gate charge circuit coupled to the gate to control charge and discharge of a parasitic capacitance associated with the gate.

3. The apparatus of claim 2 wherein the parasitic capacitance is a capacitance formed between the gate and a source of the transistor.

4. The apparatus of claim 2 wherein the slow gate charge circuit comprises a first gate charge resistor, and the parasitic capacitance charges and discharges via the first gate charge resistor.

5. The apparatus of claim 4 wherein the slow gate charge circuit comprises a second gate charge resistor, and the parasitic capacitance charges or discharges via the second gate charge resistor.

6. The apparatus of claim 5 wherein a control voltage is applied to the gate via the slow gate charge circuit.

7. The apparatus of claim 1 wherein the buffer comprises a buffer capacitor coupled to the gate.

8. The apparatus of claim 7 wherein the buffer comprises a buffer resistor coupled to the buffer capacitor in series.

9. A method comprising:
in load-switcher circuitry configured to drive a load and including a load-driving transistor, coupling a buffer between a transistor output driving the load and a gate of the transistor; and
coupling a slow gate charge circuit between the gate and a control voltage.

10. The method of claim 9 wherein the buffer comprises a resistor and capacitor connected in series, and further comprising coupling the capacitor to the gate.

11. The method of claim 9 wherein the slow gate charge circuit comprises a first gate charge capacitor and a second gate charge capacitor, and wherein a capacitance associated with the gate is charged and discharged via the first gate charge capacitor.

12. The method of claim 11 wherein the capacitance is a parasitic gate-source capacitance of the transistor.

13. Load-switcher circuitry comprising:
a load-driving transistor; and
a slow gate charge circuit coupling a control voltage to a gate of the load-driving transistor, wherein a parasitic capacitance associated with the gate charges and discharges via the slow gate charge circuit; and
a buffer coupled between a transistor output of the load-driving transistor and the gate.

14. The load-switcher circuitry of claim 13 wherein the buffer comprises a buffer capacitor and the buffer capacitor is directly coupled to the gate.

15. The load-switcher circuitry of claim 14 wherein the buffer comprises a buffer resistor coupled to the buffer capacitor in series, and the buffer resistor is also coupled to the transistor output.

16. The load-switcher circuitry of claim 15 wherein the buffer effects a Miller effect with regard to the load-driving transistor.

17. The load-switcher circuitry of claim 13 wherein the parasitic capacitance is a capacitance between the gate and a source of the load-driving transistor.

18. The load-switcher circuitry of claim 13 wherein the slow gate charge circuit comprises a pair of resistors, and the parasitic capacitance charges and discharges via a resistor of the pair of resistors.

19. The load-switcher circuitry of claim 13 wherein the pair of resistors are connected in series and couple the control voltage to the gate.

* * * * *